US010497771B1

United States Patent
Ohara et al.

(10) Patent No.: US 10,497,771 B1
(45) Date of Patent: Dec. 3, 2019

(54) DISPLAY DEVICE

(71) Applicant: Sharp Kabushiki Kaisha, Sakai, Osaka (JP)

(72) Inventors: Masanori Ohara, Sakai (JP); Shinichi Kawato, Sakai (JP); Manabu Niboshi, Sakai (JP); Seiichi Mitsui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/464,716

(22) PCT Filed: Jun. 7, 2017

(86) PCT No.: PCT/JP2017/021131
§ 371 (c)(1),
(2) Date: May 29, 2019

(87) PCT Pub. No.: WO2018/225183
PCT Pub. Date: Dec. 13, 2018

(51) Int. Cl.
H01L 27/32 (2006.01)
H01L 51/50 (2006.01)
H01L 51/52 (2006.01)
H01L 51/00 (2006.01)
H01L 51/56 (2006.01)
(Continued)

(52) U.S. Cl.
CPC ...... *H01L 27/3279* (2013.01); *H01L 27/3246* (2013.01); *H01L 27/3262* (2013.01); *H01L 51/0018* (2013.01); *H01L 51/5072* (2013.01); *H01L 51/5092* (2013.01); *H01L 51/5206* (2013.01); *H01L 51/5221* (2013.01); *H01L 51/56* (2013.01); *H01L 27/1225* (2013.01); *H01L 29/7869* (2013.01); *H01L 2227/323* (2013.01); *H01L 2251/5315* (2013.01)

(58) Field of Classification Search
CPC ............. H01L 27/3279; H01L 27/3246; H01L 27/3262; H01L 27/1225; H01L 51/0018; H01L 51/5072; H01L 51/5092; H01L 51/5206; H01L 51/5221
See application file for complete search history.

(56) References Cited

U.S. PATENT DOCUMENTS

| 2008/0116463 | A1 | 5/2008 | Ito |
| 2016/0043341 | A1* | 2/2016 | Heo .................... H01L 27/3246 257/40 |

(Continued)

FOREIGN PATENT DOCUMENTS

| JP | 2006-058815 A | 3/2006 |
| JP | 2008-146026 A | 6/2008 |
| JP | 2010-020996 A | 1/2010 |

OTHER PUBLICATIONS

Official Communication issued in International Patent Application No. PCT/JP2017/021131, dated Aug. 1, 2017.

*Primary Examiner* — Nathan W Ha
(74) *Attorney, Agent, or Firm* — Keating & Bennett, LLP

(57) ABSTRACT

A display device includes a cathode electrode provided on a subpixel-by-subpixel basis, an anode electrode provided commonly for a plurality of subpixels in an upper layer with respect to the cathode electrode, a light emitting layer provided between the cathode electrode and the anode electrode, a first wiring line provided in the same layer as the cathode electrode, and a second wiring line provided in an upper layer with respect to the first wiring line and superimposed on the first wiring line.

20 Claims, 12 Drawing Sheets

(51) Int. Cl.
*H01L 29/786* (2006.01)
*H01L 27/12* (2006.01)

(56) References Cited

U.S. PATENT DOCUMENTS

| | | | |
|---|---|---|---|
| 2016/0118457 A1* | 4/2016 | Kim | H01L 27/3279 |
| | | | 257/40 |
| 2016/0322453 A1* | 11/2016 | Park | H01L 27/3258 |
| 2017/0069852 A1 | 3/2017 | Kanamoto et al. | |
| 2017/0170246 A1* | 6/2017 | Im | H01L 27/3246 |
| 2017/0279084 A1* | 9/2017 | Sakamoto | H01L 27/322 |
| 2018/0061897 A1* | 3/2018 | Oh | H01L 27/3246 |
| 2019/0273125 A1* | 9/2019 | Takechi | H01L 51/5228 |

* cited by examiner

DISPLAY DEVICE

TECHNICAL FIELD

The disclosure relates to a display device.

BACKGROUND ART

Patent Literature 1 discloses a configuration in which an organic light emitting diode (OLED) is formed by an anode electrode provided on a subpixel-by-subpixel basis, a cathode electrode provided commonly for a plurality of subpixels, and an organic EL layer provided between the anode electrode and the cathode electrode, and in which the anode electrode of the OLED is connected to a drive transistor.

CITATION LIST

Patent Literature

PTL 1: JP 2006-58815 A

SUMMARY

Technical Problem

In the known configuration, in a case where the drive transistor has N channels, a source follower configuration is adopted in which sources of the channels are connected to the anode electrodes of the OLED, thus leading to a problem that a current value of the OLED tends to vary.

Solution to Problem

A display device according to an aspect of the disclosure includes a cathode electrode provided on a subpixel-by-subpixel basis, an anode electrode provided commonly for a plurality of subpixels in an upper layer with respect to the cathode electrode, a light emitting layer provided between the cathode electrode and the anode electrode, a first wiring line provided in a same layer as the cathode electrode, and a second wiring line provided in an upper layer with respect the first wiring line and a lower layer with respect to the anode electrode, the second wiring line being superimposed on the first wiring line.

Advantageous Effects of Disclosure

According to an aspect of the disclosure, a variation in value of an electric current flowing from the anode electrode to the cathode electrode by way of the light emitting layer can be suppressed.

Figure 2:
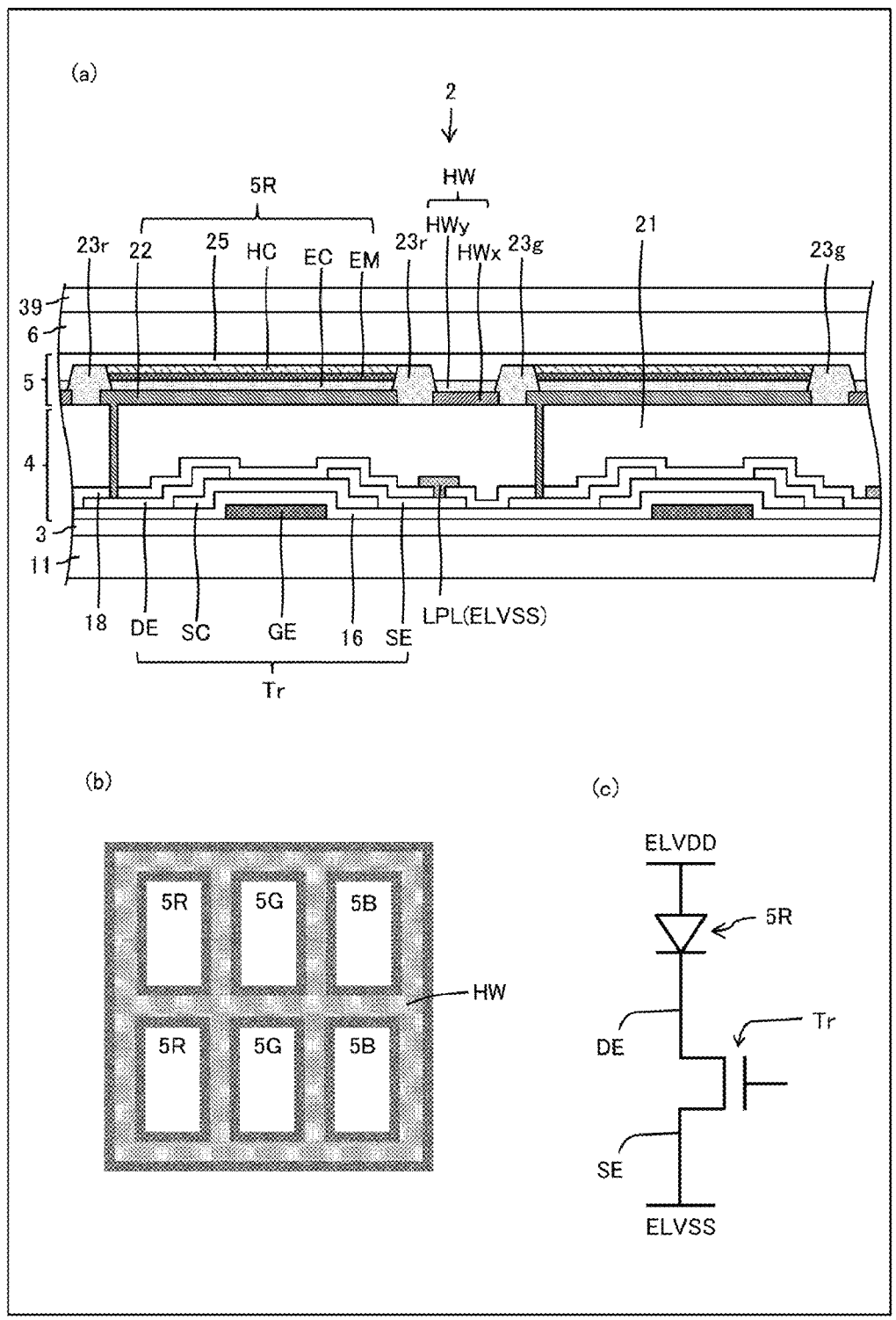

(a) of FIG. 2 is a cross-sectional view illustrating a configuration example of a display device of a first embodiment, (b) of FIG. 2 is a plan view illustrating a configuration of a light emitting element and an anode auxiliary wiring line of the display device, and (c) of FIG. 2 is a circuit diagram illustrating a connection example of the light emitting element and a drive transistor.

Figure 3:
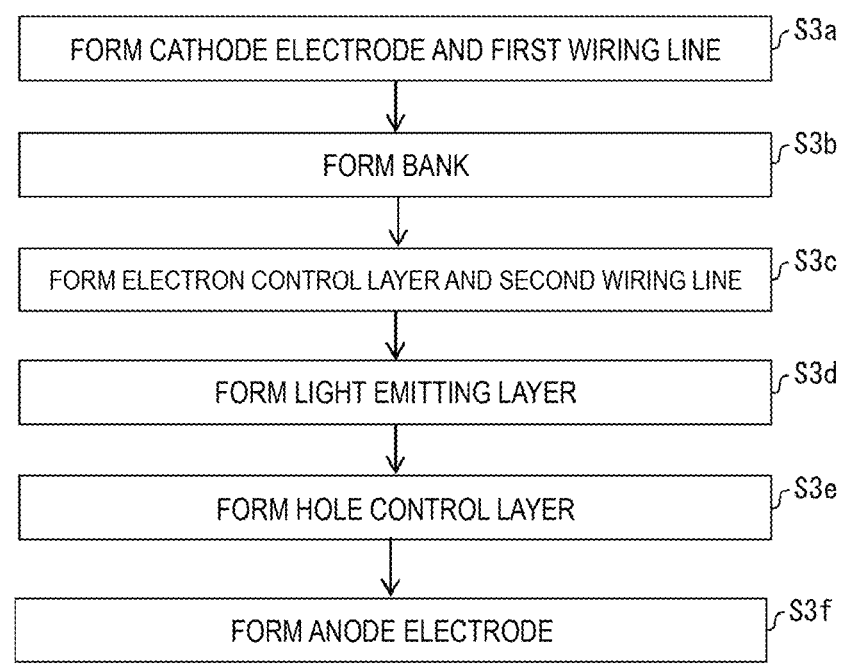

FIG. 3 is a flowchart illustrating an example of a forming method of a light emitting element layer.

Figure 4:
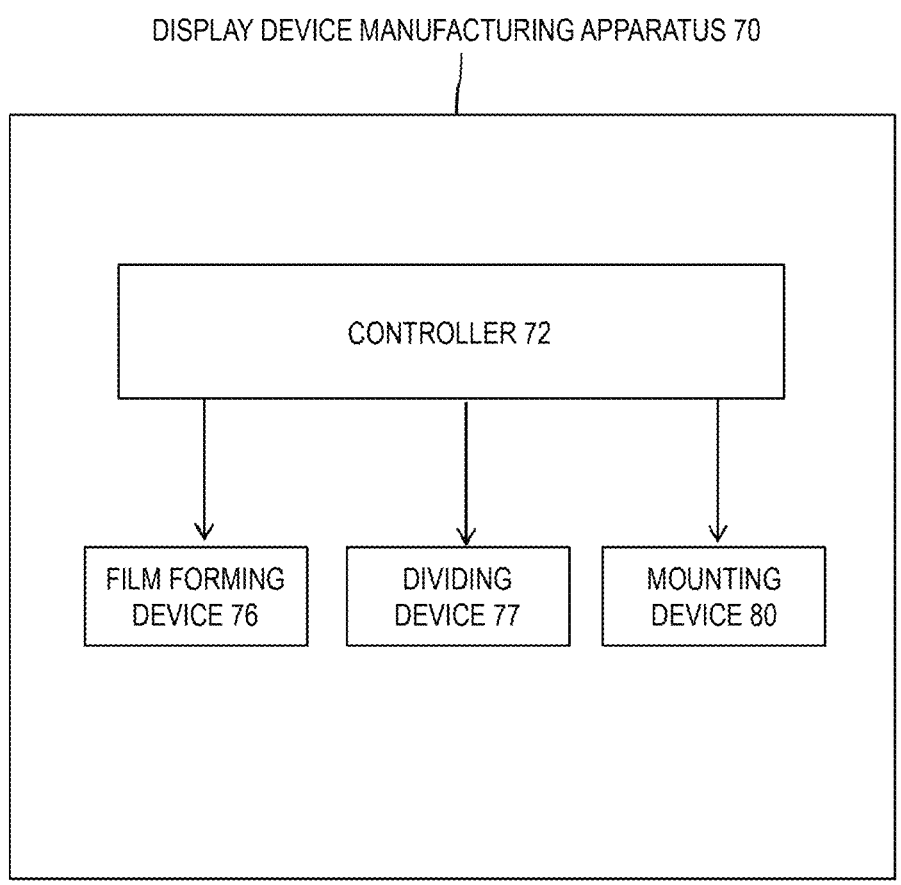

FIG. 4 is a schematic block diagram illustrating a configuration of a display device manufacturing apparatus.

Figure 5:
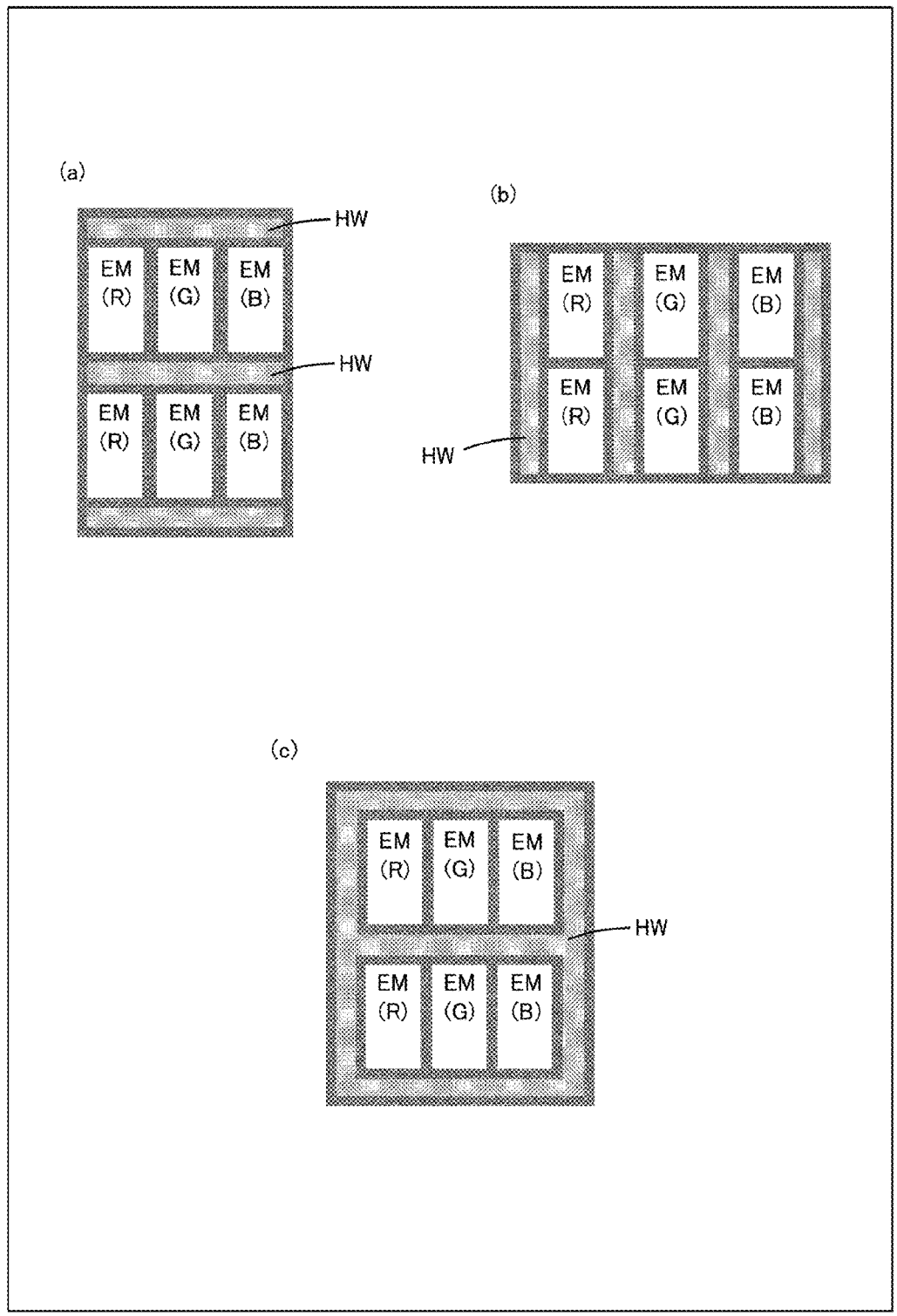

FIG. 5 is a plan view illustrating configuration examples of anode electrode auxiliary wiring lines.

Figure 6:
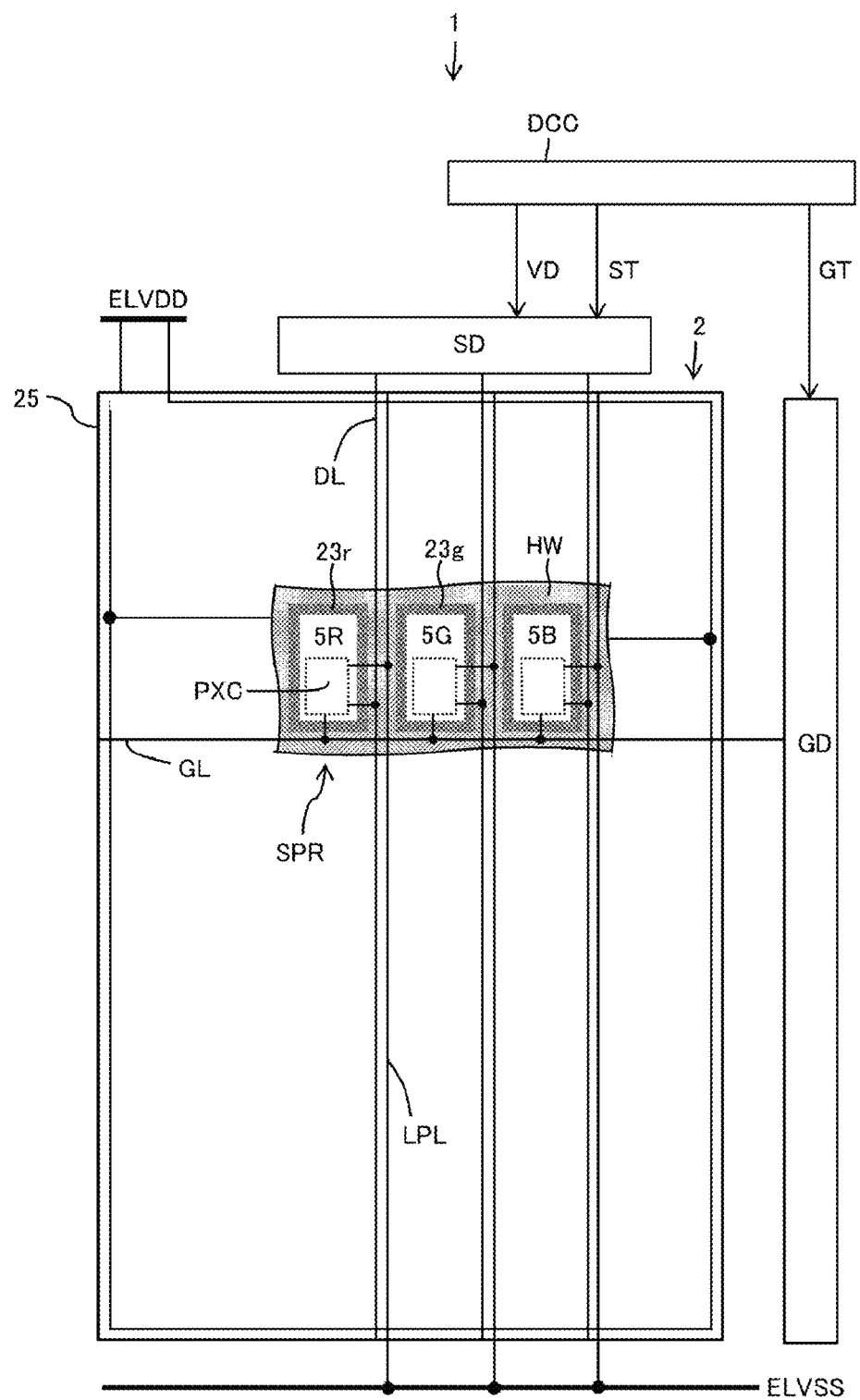

FIG. 6 is a schematic plan view illustrating a configuration of a display apparatus including a display device.

Figure 7:
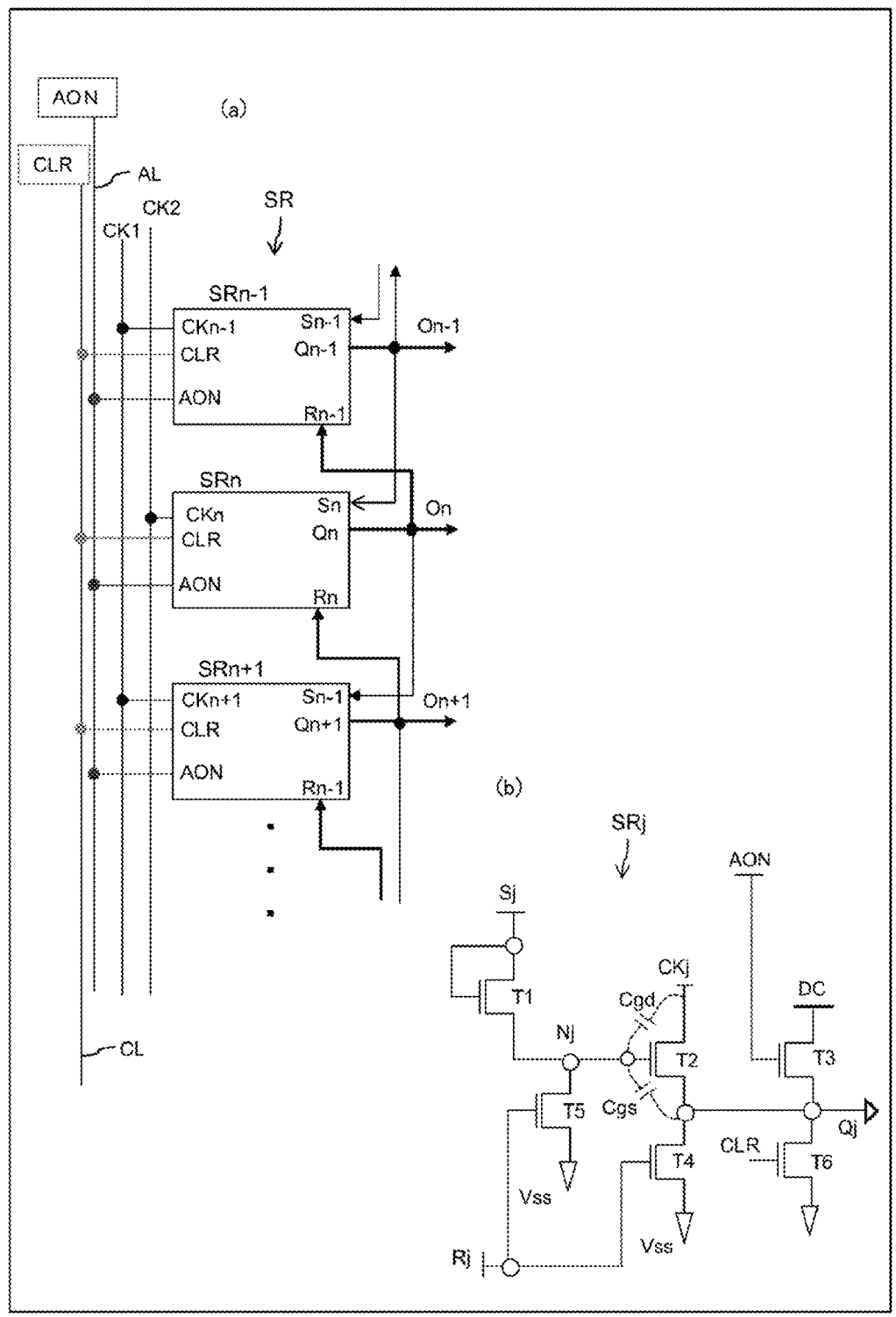

(a) of FIG. 7 is a circuit diagram illustrating a configuration example of a gate driver, and (b) of FIG. 7 is a circuit diagram illustrating a configuration of a shift register.

Figure 8:
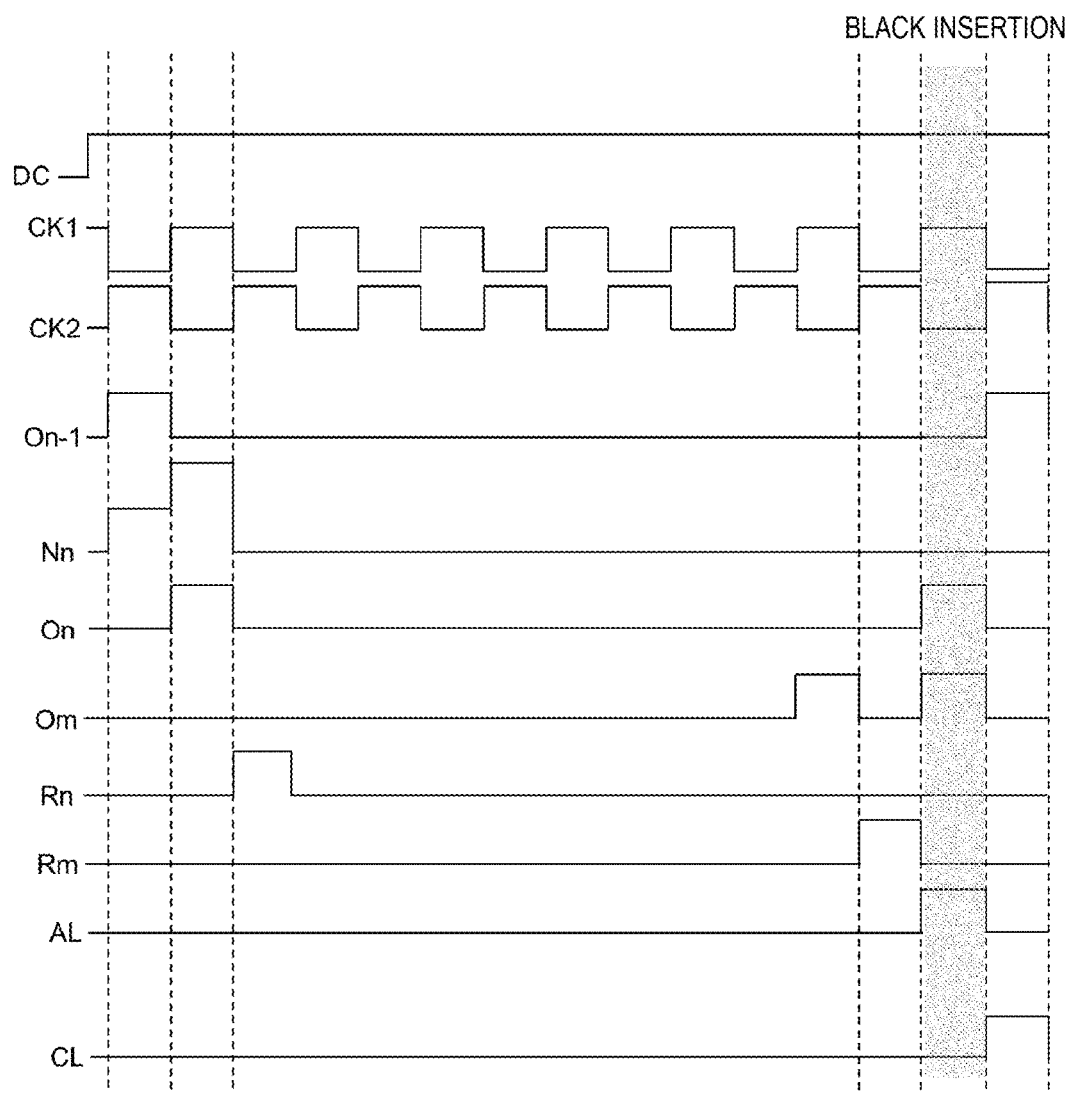

FIG. 8 is a timing chart illustrating an operation of a gate driver.

Figure 9:
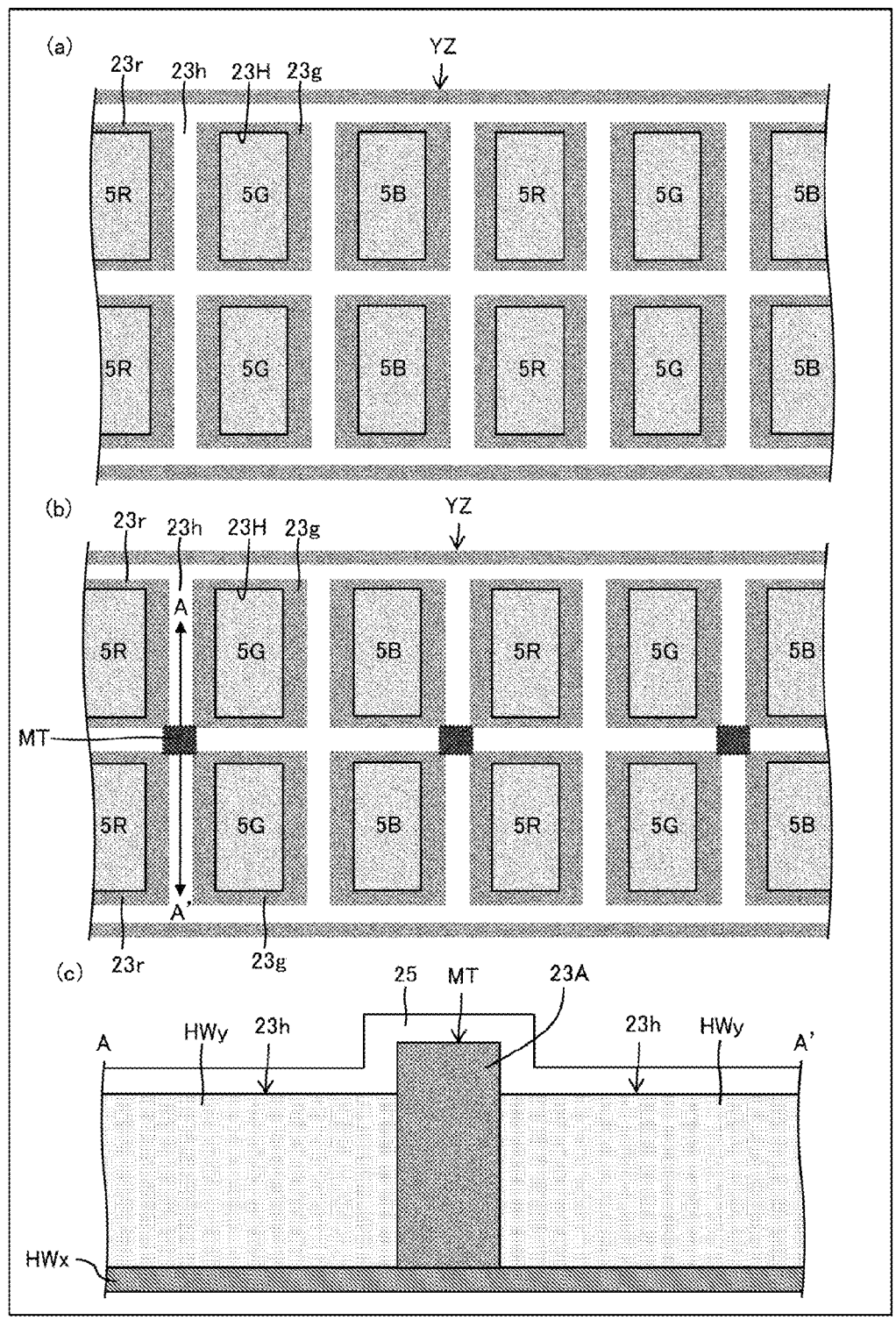

(a) and (b) of FIG. 9 are plan views illustrating another configuration example of the first embodiment, and (c) of FIG. 9 is a cross-sectional view of (b) of FIG. 9.

Figure 10:
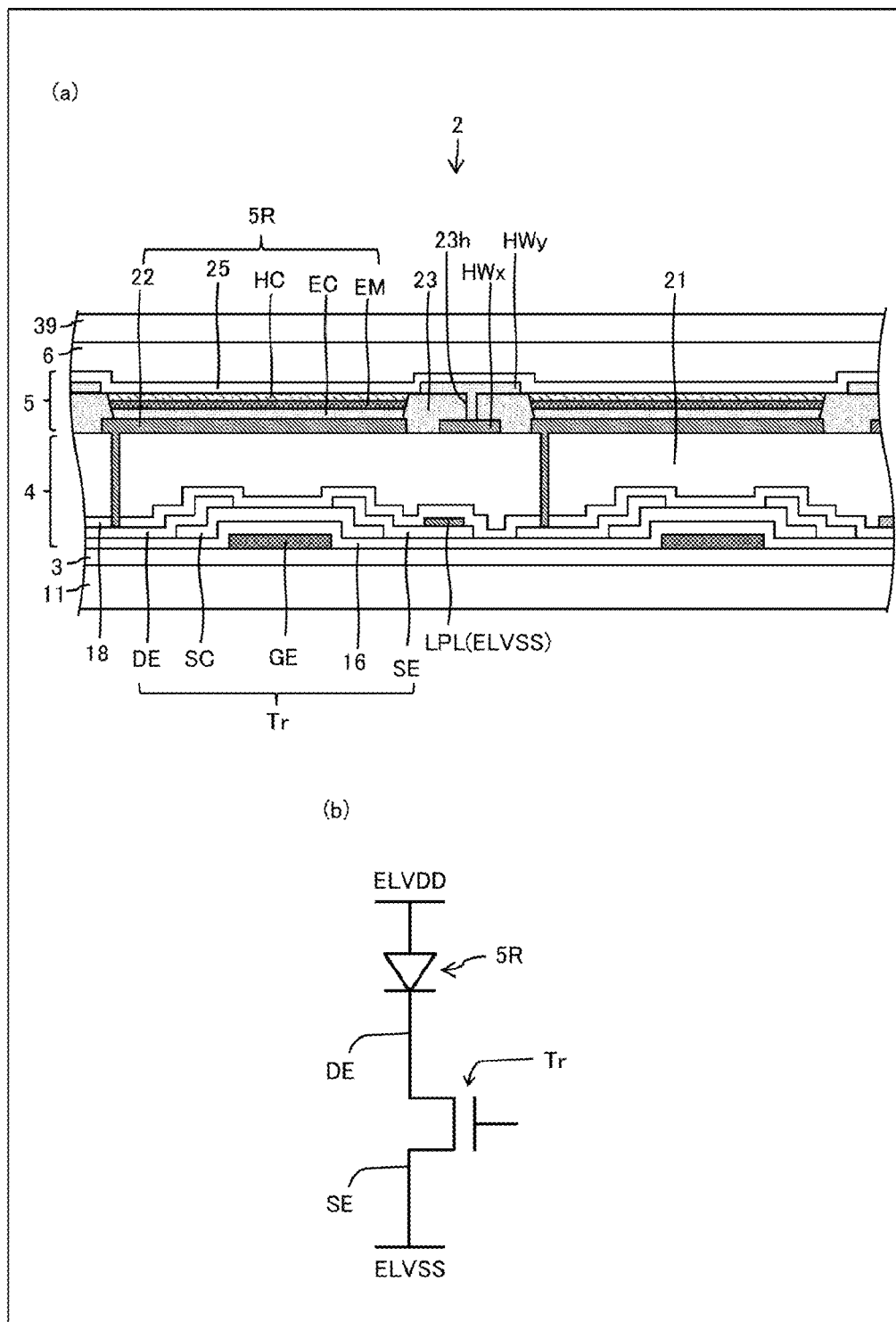

(a) of FIG. 10 is a cross-sectional view illustrating a configuration example of a display device of a second embodiment, and (b) of FIG. 10 is a circuit diagram illustrating a connection example of a light emitting element and a drive transistor.

Figure 11:
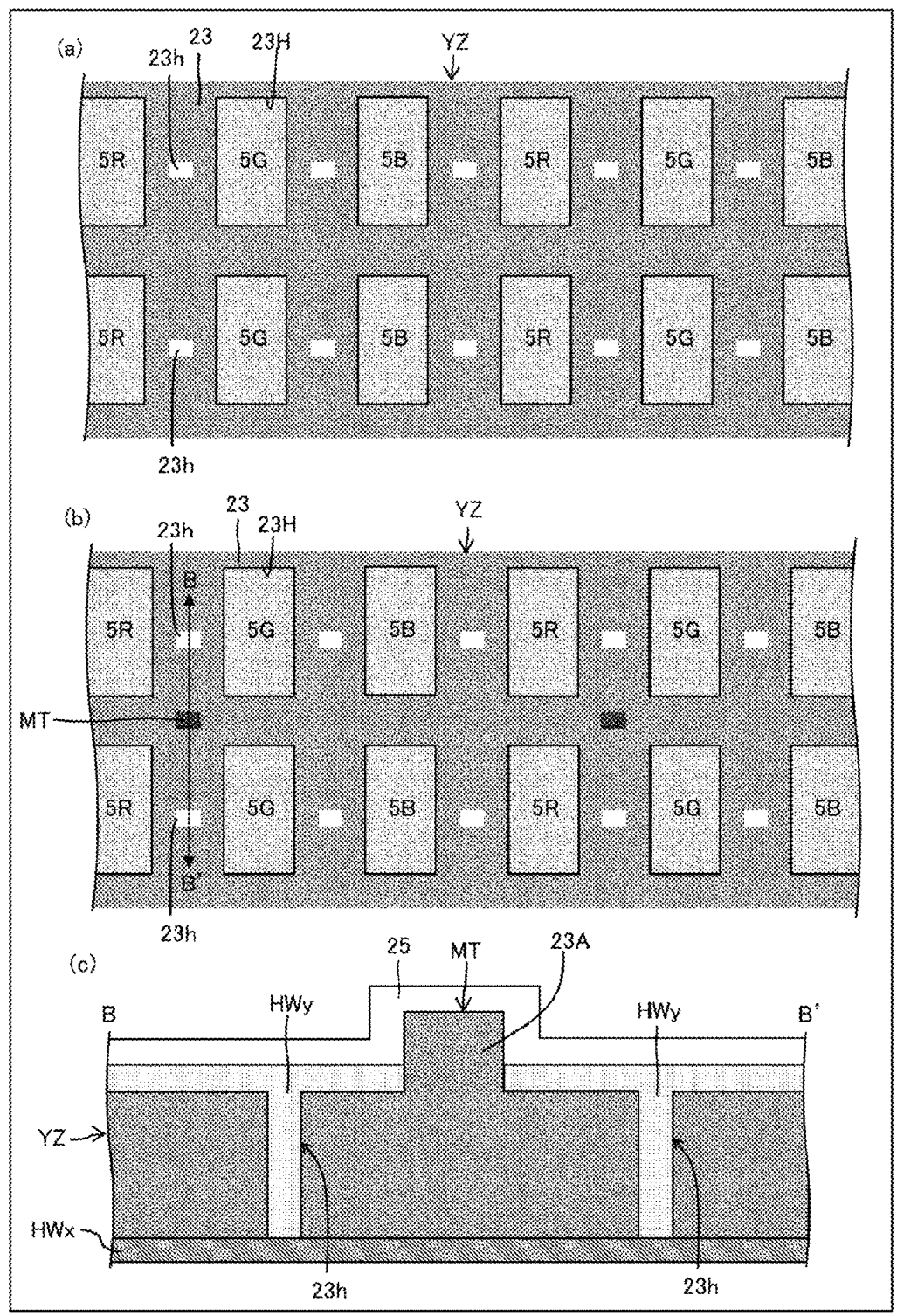

(a) and (b) of FIG. 11 are plan views illustrating another configuration example of the second embodiment, and (c) of FIG. 11 is a cross-sectional view of (b) of FIG. 11.

Figure 12:
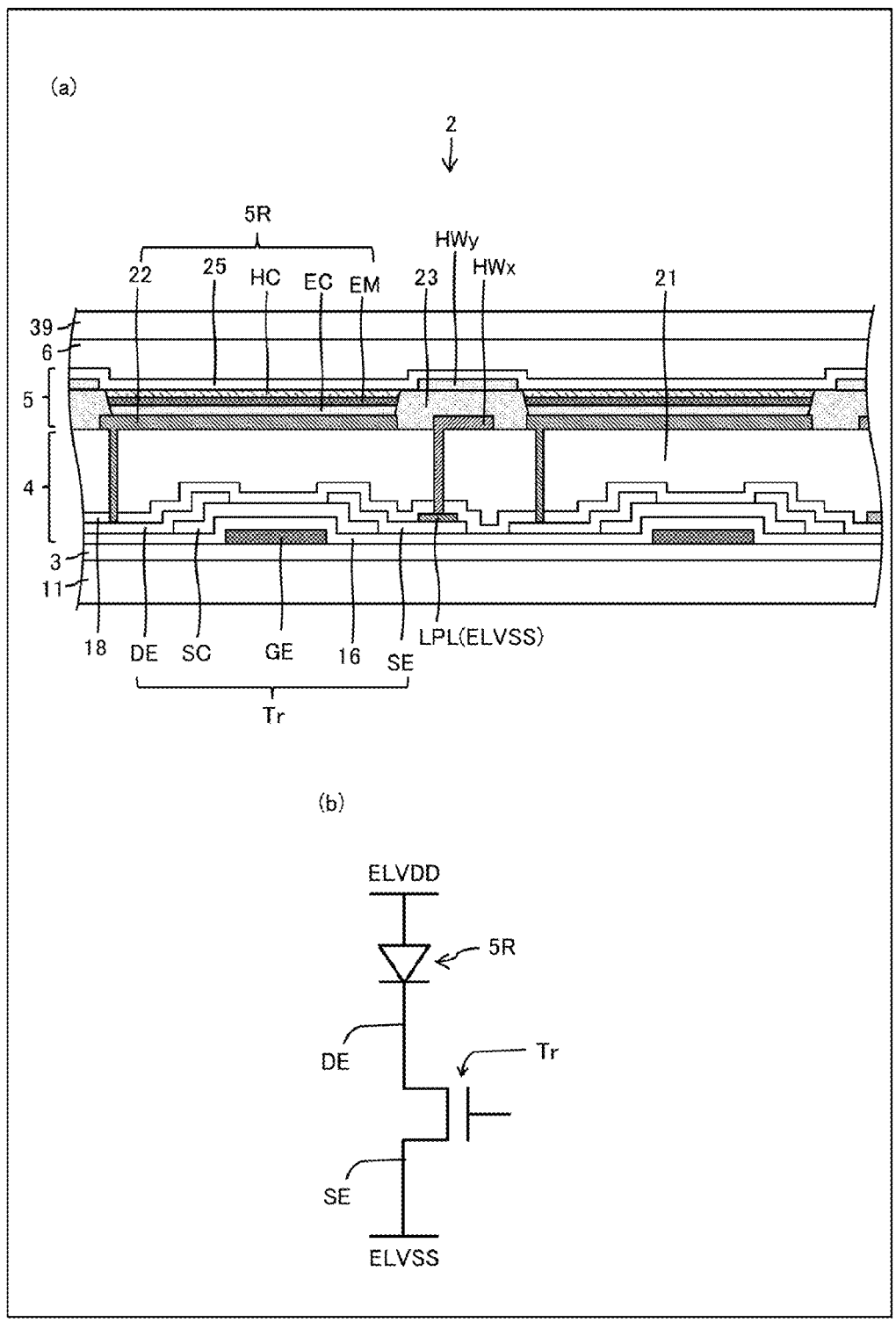

(a) of FIG. 12 is a cross-sectional view illustrating a configuration example of a display device of a third embodiment, and (b) of FIG. 12 is a circuit diagram illustrating a connection example of a light emitting element and a drive transistor.

DESCRIPTION OF EMBODIMENTS

First Embodiment

Figure 1:
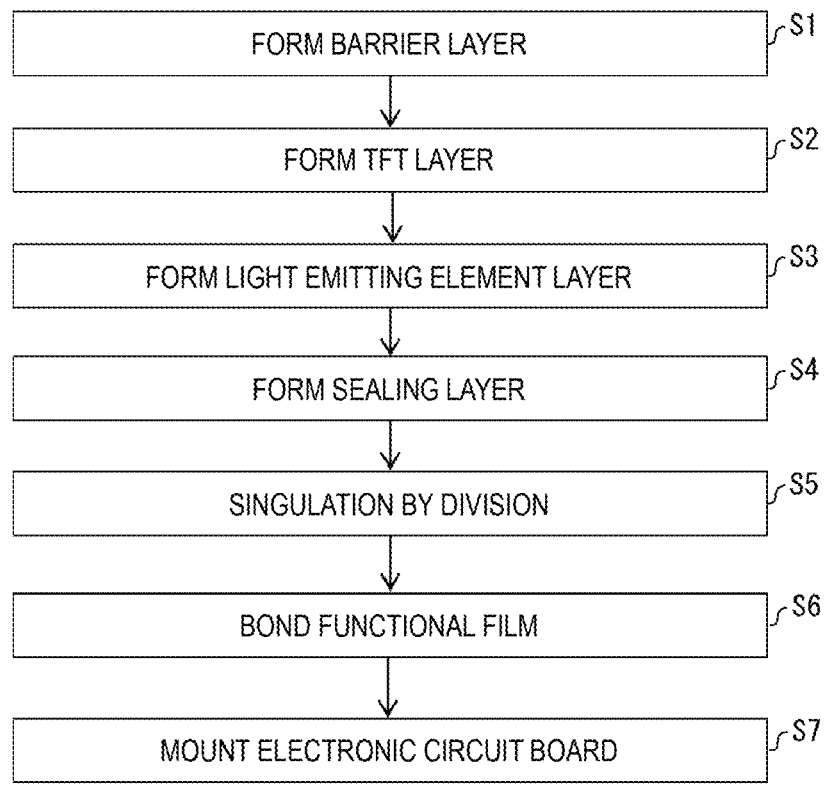
FIG. 1 is a flowchart illustrating an example of a manufacturing method for a display device.

FIG. 1 is a flowchart illustrating an example of a manufacturing method for a display device. (a) of FIG. 2 is a cross-sectional view illustrating a configuration example of a display device, (b) of FIG. 2 is a plan view illustrating a configuration of a light emitting element and an anode auxiliary wiring line of the display device, and (c) of FIG. 2 is a circuit diagram illustrating part of a subpixel circuit provided for each subpixel.

When a display device is manufactured, for example, as illustrated in FIGS. 1 and 2, firstly, a barrier layer 3 is formed on a base material (for example, a mother glass) 11 (step S1). Next, a TFT layer 4 is formed (step S2). Next, a light emitting element layer (for example, an OLED element layer) 5 is formed (step S3). Next, a sealing layer 6 is formed (step S4). Next, division is performed and a plurality of individual pieces are cut out (step S5) Next, a functional film 39 is bonded to an upper side of the sealing layer 6 of each of the singulated pieces via an adhesive (step S6). Next, an electronic circuit board (an IC chip, an FPC or the like) is mounted on a terminal portion of each of the singulated pieces. In this way, a display device 2 illustrated in FIG. 2 is obtained. Note that each of the steps illustrated in FIG. 1 is performed by a display device manufacturing apparatus.

The barrier layer 3 is an undercoat layer configured to prevent moisture or impurities from reaching the TFT layer 4 or the light emitting element layer 5 and can be constituted by, for example, a silicon oxide film, a silicon nitride film or a silicon oxynitride film, or a layered film of these films that are formed using CVD.

The TFT layer 4 includes a gate electrode GE, an inorganic insulating film 16 (a gate insulating film) formed on an upper side of the gate electrode GE, a semiconductor film SC formed on an upper side of the inorganic insulating film 16, a source electrode SE and a drain electrode DE that are formed on an upper side of the semiconductor film SC, an inorganic insulating film 18 formed on an upper side of the source electrode SE and the drain electrode DE, a (lower potential side) light emitting power supply wiring line LPL formed on an upper side of the inorganic insulating film 18, and a flattening film 21 formed on an upper side of the light emitting power supply wiring lie LPL.

The semiconductor film SC is formed of, for example, low temperature polycrystalline silicon (LTPS) or amorphous silicon. The inorganic insulating films 16 and 18 can be constituted by a silicon oxide (SiOx) film or a silicon nitride (SiNx) film, or a layered film of these, formed using CVD. The gate electrode GE, the source electrode SE, the drain electrode DE, and the light emitting power supply wiring line LPL are each constituted by a single-layer metal film or a layered metal film including at least one of aluminum (Al), tungsten (W), molybdenum (Mo), tantalum (Ta), chromium (Cr), titanium (Ti), and copper (Cu), for example. Note that in FIG. 2, a transistor Tr in which the semiconductor film SC is used as a channel is illustrated as adopting a bottom gate structure, but the transistor Tr may adopt a top gate structure (for example, where the semiconductor film SC is formed of LTPS). The flattening film (interlayer insulating film) 21 can be constituted, for example, by a coatable photosensitive organic material, such as a polyimide, an acrylic, or the like.

The light emitting element layer 5 (for example, the organic light emitting diode layer) includes a cathode (a negative electrode) 22 and a first wiring line HWx that are formed on an upper side of the flattening film 21, banks 23r and 23g configured to specify subpixels, a second wiring line HWy formed on the first wiring line HWx, an electron control layer EC formed on an upper side of the cathode 22, a light emitting layer EM formed on an upper side of the electron control layer EC, a hole control layer HC formed on an upper side of the light emitting layer EM, and an anode (a positive electrode) 25 that covers the second wiring line Hwy and the hole control layer HC. The electron control layer EC functions as an electron transport layer and an electron injection layer, and the hole control layer EC functions as a hole transport layer and a hole injection layer.

For example, a red light emitting element 5R is formed by the electron control layer EC, the light emitting layer EM, the hole control layer HC, and the anode 25, and a red subpixel is formed by the red light emitting element 5R and a subpixel circuit for driving the red light emitting element 5R. Additionally, an anode auxiliary wiring line HW is constituted by the first wiring line HWx and the second wiring line Hwy that are superimposed on each other. The anode auxiliary wiring line HW is formed into a matrix shape in gaps between the subpixels (gaps between the light emitting elements).

The cathode 22 is formed for each subpixel, the anode 25 is formed commonly for a plurality of subpixels, and the light emitting layer EM is formed on an area surrounded by the bank 23r corresponding to a subpixel SR. The hole control layer HC can also be formed commonly for a plurality of subpixels.

The cathode 22 constituted by an anode electrode 22 is formed by layering Indium Tin Oxide (ITO) and an alloy containing Ag, and has light reflectivity. The anode 25 can be constituted by a light-transmissive conductive material such as Indium Tin Oxide (ITO), Indium Zinc Oxide (IZO) and the like. The cathode 22 is connected to a first light emitting power supply line LPL for supplying a low potential side light emitting power supply potential ELVSS via the transistor Tr.

The electron control layer EC can be constituted by, for example, a light-transmissive oxide semiconductor film. The electron control layer EC may include an oxide semiconductor containing at least on metal element of In, Ga and Zn, for example, an In—Ga—Zn—O based semiconductor. Here, the In—Ga—Zn—O based semiconductor is a ternary oxide of indium (In), gallium (Ga), and zinc (Zn), and a ratio (a composition ratio) of In, Ga, and Zn is not particularly limited to a specific value, including, for example, a ratio of In:Ga:Zn=2:2:1, In:Ga:Zn=1:1:1, In:Ga:Zn=1:1:2, and the like.

The cathode (the negative electrode) 22 and the electron control layer EC can be patterned using a photolithography method after a spattering film formation. The cathode (the negative electrode) 22 and the first wiring line HWx can be formed in the same step, in the same layer and of the same material (for example, an alloy having light reflectivity), and the electron control layer EC and the second wiring line Hwy can be formed in the same step, in the same layer and of the same material (for example, an oxide semiconductor).

In the first embodiment, a so-called inverted structure is adopted in which for example, as illustrated in (c) of FIG. 2, the anode 25 of the light emitting element 5R is connected to a supply source of a high potential side light emitting power supply potential ELVDD, the cathode 22 thereof is connected to the drain electrode DE of the transistor Tr (the drive transistor), and the source electrode SE of the transistor Tr is connected to a supply source of a low potential side light emitting power supply potential ELVSS.

FIG. 3 is a flowchart illustrating an example of a forming method of a light emitting layer. In step S3 in FIG. 1, for example, as illustrated in FIG. 3, the cathode 22 and the first wiring line HWx are formed by forming a film (for example, an alloy film having light reflectivity) by spattering and patterning through the photolithography method (step S3a). Next, the banks 23r and 23g are formed by forming a film (for example, an organic resin film) by coating and patterning through the photolithography method (step S3b). Next, the electron control layer EC and the second wiring line Hwy are formed by forming a film (for example, an oxide semiconductor film) by spattering and patterning through the photolithography method (step S3c). Next, the light emitting layer EM is formed by forming a film by vapor deposition through a mask (step S3d). Next, the hole control layer HC is pattern formed by vapor deposition through a mask (step S3e). Next, the anode 25 (for example, a metal compound film having optical transparency) is pattern formed by spattering through a mask (step S3f).

Note that, in step S3c, an annealing process, a plasma process or the like is desirably performed to enhance the conductivity of the electron control layer EC and the second wiring line Hwy that are constituted by the oxide semiconductor, and as this occurs, the oxide semiconductor making up the channel of the transistor Tr has a different electric resistance value from an electric resistance value at the electron control layer EC and the second wiring line HWy.

The first wiring line HWx is formed between the adjacent cathodes 22, and the second wiring line Hwy is formed in such a manner as to be superimposed directly on (to be brought into direct contact with) the first wiring line HWx. The anode 25 is formed solidly in such a manner as to cover the hole control layer HC and the second wiring line HWy. In this way, the first wiring line HWx, the second wiring line Hwy and the anode 25 are electrically connected to one another.

With the light emitting element layer 5 constituted by the OLED layer, positive holes and electrons are recombined inside the light emitting layer by a drive current between the cathode 22 and the anode 25, and light is emitted as a result of exitons that are generated by the recombination falling into a ground state. Since the cathode 22 has light reflectivity and the anode 25 has optical transparency, the light emitted from the light emitting layer EM travels upward, whereby a top emission results.

The light emitting element layer 5 is not limited to OLED element configurations, and may be an inorganic light emitting diode or a quantum dot light emitting diode.

The sealing layer 6 is an overcoat layer that covers the light emitting element layer 5 and prevents foreign matters such as water, oxygen and the like from penetrating into the light emitting element layer 5, and includes a light-transmissive inorganic insulating film such as a silicon oxide film, a silicon nitride film, a silicon oxynitride film, and the like.

The functional film 39 is a film including, for example, an optical compensation function, a touch sensor function, a protection function, or the like and is bonded to an upper side of the sealing layer 6 through OCR or the like.

FIG. 4 is a block diagram illustrating a display device manufacturing apparatus 70 according to the first embodiment. The display device manufacturing apparatus 70 includes a controller 72, a film forming device 76, a dividing device 77, and a mounting device 80. The film forming device 76 forms the individual layers of the display device 2. The dividing device 77 cuts out display devices 2 from the mother substrate. The mounting device 80 mounts electronic circuit boards on the display devices 2. The controller 72 controls the film forming device 76, the dividing device 77, and the mounting device 80.

In the first embodiment, as illustrated in FIG. 2 the inverted structure is adopted in which for example, the anode 25 of the light emitting element 5R is connected to the supply source of the high potential side light emitting power supply potential ELVDD, the cathode 22 thereof is connected to the drain electrode DE of the transistor Tr (the drive transistor), and the source electrode SE of the transistor Tr is connected to the supply source of the low potential side light emitting power supply potential ELVSS, and the solid anode 25 is electrically connected to the anode electrode auxiliary wiring line HW (the layered wiring line of the first wiring line HWx and the second wiring line Hwy) in a matrix, whereby an anode-side parasitic resistance is largely reduced, and hence, an in-plane variation in anode potential attributed to an IR drop is hardly generated. This suppresses a variation in drive current of the light emitting element 5R (a luminance variation between subpixels of the same color and the same grayscale). Although the red light emitting element 5R is described here, what has been described in relation to the red light emitting element 5R is true with a blue light emitting element and a green light emitting element.

In the top emission structure, since an electrode in an upper layer (the common anode 25 in FIG. 2) cannot be thickened to maintain the light transmission properties, it is a great advantage to reduce the anode-side parasitic resistance by the anode electrode auxiliary wiring line HW. For example, assuming that an electric resistivity ratio of the anode, the first wiring line and the second wiring line is referred to as 1:1:4 and a surface area ratio thereof is referred to as 5:1:1 (with a common thickness), the anode-side parasitic resistance is reduced by 20 percent by adding the anode electrode auxiliary wiring line HW.

Additionally, the oxide semiconductor can be used for the electron control layer EC (the electron transport layer ETL and the electron injection layer EIL) by adopting the inverted structure in which the cathode of the light emitting element is connected to the drain electrode of the drive transistor as illustrated in FIG. 2C. This allows not only the known pattern forming of an organic film through mask vapor deposition but a patterning using the photolithography method to be used for the electron control layer EC, whereby the second wiring line HWy lying in the same layer as the electron control layer EC can be processed with substantially the same accuracy as the first wiring line HWx. That is, a gap between the banks can be narrowed, which is preferable for high precision manufacturing. With the mask vapor deposition, the line space accuracy is of the order of 20 μm at the most, whereas with the patterning using the photolithography method, the line space accuracy can be increased to 5 μm or higher.

FIG. 5 is a plan view illustrating configuration examples of anode electrode auxiliary wiring lines. The shape of the anode electrode auxiliary wiring line HW is not limited to the fine matrix shape and hence may be a transverse stripe shape as illustrated in (a) of FIG. 5, a vertical stripe shape as illustrated in (b) of FIG. 5 or a coarse matrix shape formed in gaps between pixels (including three light emitting elements of R, G and B). Thus, the shape of the anode electrode auxiliary wiring line HW can be determined in consideration of the anode-side resistance value, the degree of precision of the subpixel, and the like.

FIG. 6 is a schematic plan view illustrating the configuration of a display apparatus including the display device. As illustrated in FIG. 6, the display apparatus 1 includes the display device 2, a source driver SD, a gate driver GD, and a display control circuit DCC. The display device 2 includes a red light emitting element 5R, a green light emitting element 5G and a blue light emitting element 5B that are formed on the light emitting element layer 5, as well as a subpixel circuit PXC, a data line DL, a scanning signal line GL and a (low potential side) light emitting power supply wiring line LPL that are formed on the TFT layer 4, and a subpixel SPR is constituted by, for example, the red light emitting element 5R and the subpixel circuit PXC corresponding thereto.

In the display device 2, the light emitting element and the subpixel circuit PXC connected to the light emitting element are provided for each subpixel, and the subpixel circuit PXC is connected to the data line DL, the scanning signal line GL, and the light emitting power supply wiring line LPL. The data line DL is connected to the source driver SD, the scanning signal line GL is connected to the gate driver GD, the light emitting power supply wiring line LPL is connected to the supply source of ELVSS, and the solid anode 25 and the anode electrode auxiliary wiring line HW in a matrix are connected to the supply source of ELVDD. The display control circuit DCC outputs a source timing signal ST and a video data VD to the source driver SD and outputs a gate timing signal GT to the gate driver GD.

(a) of FIG. 7 is a circuit diagram illustrating a configuration example of the gate driver, and (b) of FIG. 7 is a circuit diagram illustrating the configuration of a shift register. As illustrated in (a) of FIG. 7, the gate driver GD includes a shift register SR including first to mth stages, two-phase clock lines CK1 and CK2, an all-on signal line AL, and a clear signal line C1, and assuming that j=1 to m, a shift register circuit SRj constituting a j stage includes transistors T1 to T6, a node Nj, a set terminal Sj, a reset terminal Rj, a clock terminal CKj, an all-on terminal AON, a clear terminal CLR, and an output terminal Qj.

For example, as to an nth stage shift register circuit SRn, a set terminal Sn is connected to an output terminal Qn of the previous stage, a reset terminal Rn is connected to an output terminal Qn+1 of a post stage, a clock terminal CKn is connected to the clock signal line CK2, an all-on terminal AON is connected to the all-on signal line AL, a clear terminal CLR is connected to the clear signal line CL, and an output signal On from an output terminal Qn is supplied to an nth scanning signal line GL.

FIG. 8 is a timing chart illustrating an operation of the gate driver. An output signal On−1 of an n−1 stage is supplied to a node Nn via the transistor T1 that is diode bonded. The node Nn is boosted up by capacitance coupling of a parasitic capacitances Cgd (an inter-gate drain parasitic capacitance) and Cgs (an inter-gate source parasitic capacitance) of T2 during a period when CK2 becomes "High". The transistor T2 is ON as a result of the node Nn being boosted up, and an output signal Qn of the nth stage is pulled up from "Low" to "High". The potentials of the output signal Qn and the node Nn are pulled down when the reset terminal Rn that receives an output signal QnP1 of the next stage becomes "High". When shifts to a final stage are completed, the AON signal becomes "High", and DC signals are outputted from all the stages, whereby the subpixels are displayed black (a black insertion). When the black insertion period ends, the CLR signal becomes "High", and output signals from all the stages are pulled down from "High" to "Low".

(a) and (b) of FIG. 9 are plan views illustrating another configuration example of the first embodiment, and (c) of FIG. 9 is a cross-sectional view of (b) of FIG. 9. In the first embodiment, the organic insulating film YZ constituting the banks 23r and 23g includes, for example, a main opening 23H where the light emitting layer EM is formed and a sub-opening 23h in which at least part of the second wiring line Hwy is formed in an interior and which has a belt-like shape in a plan view. The sub-opening 23h runs vertically and horizontally in a plan view. The organic insulating film YZ includes the banks 23r and 23g that are edge cover portions covering edges of the cathodes and a thick film portion 23A that is formed thicker than the banks 23r and 23g in a position close to the banks 23r and 23g, and the thick film portion 23A forms a projecting portion MT with which a vapor deposition mask is brought into abutment. In (c) of FIG. 9, the thick film portion 23A is formed in such a manner to be in contact with the belt-shaped sub-opening 23h in a plan view.

Second Embodiment (a) of FIG. 10 is a cross-sectional view illustrating a configuration example of a display device of a second embodiment, and (b) of FIG. 10 is a circuit diagram illustrating a connection example of a light emitting element and a drive transistor. Although the first wiring line HWx is formed on the second wiring line Hwy, the configuration is not limited thereto. A configuration may be adopted in which as illustrated in (a) of FIG. 10, a first wiring line HWx in a lower layer is covered by a bank 23 (an organic insulating film), and the first wiring line HWx is connected with a second wiring line Hwy in an upper layer via an opening 23h (a contact hole) that penetrates the bank 23, while the second wiring line HWy is brought into contact (is electrically connected) with an anode 25. This suppresses a variation in drive current of a light emitting element 5R (that is, a luminance variation between subpixels of the same color and the same grayscale) while enhancing the degree of precision of a subpixel.

(a) and (b) of FIG. 11 are plan views illustrating another configuration example of the second embodiment, and (c) of FIG. 11 is a cross-sectional view of (b) of FIG. 11. In the second embodiment, the organic insulating film YZ constituting the bank 23 includes, for example, a main opening 23H where a light emitting layer EM is formed and a sub-opening 23h in which at least part of the second wiring line Hwy is formed in an interior and which has a dot shape in a plan view. The organic insulating film YZ includes the bank 23 constituting an edge cover portion covering edges of a cathode and a thick film portion 23A that is formed thicker than the bank 23 in a position close to the bank 23, and the thick film portion 23A can form a projecting portion MT with which a vapor deposition mask is brought into abutment. In (c) of FIG. 11, the thick film portion 23A is formed spaced away from the dot-shaped sub-opening 23h in a plan view.

Third Embodiment (a) of FIG. 12 is a cross-sectional view illustrating a configuration example of a display device of a third embodiment, and (b) of FIG. 12 is a circuit diagram illustrating a connection example of a light emitting element and a drive transistor. Although the first wiring line HWx and the second wiring line HWy are each electrically connected to the anode 25 in the first and second embodiments, the configuration is not limited thereto. A configuration may be adopted in which as illustrated in (a) of FIG. 12, a first wiring line HWx in a lower layer is covered by a bank 23, and the first wiring line HWx is connected with a light emitting power supply wiring line LPL in a TFT layer 4 via a contact hole, and a second wiring line HWy is brought into contact (is electrically connected) with an anode 25. By adopting this configuration, in an inverted structure as illustrated in (b) of FIG. 12, in addition to a reduction in anode-side resistance value, a reduction in resistance value of the light emitting power supply wiring line LPL can be realized, whereby a variation in drive current of a light emitting element 5R (that is, a luminance variation between subpixels of the same color and the same grayscale) can be suppressed. Additionally, the degree of precision of a subpixel can be enhanced.

Supplement

An electro-optical element (an electro-optical element whose luminance and transmittance are controlled by an electric current) that is provided in a display device according to the present embodiment is not particularly limited thereto. Examples of the display device according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device including a cathode electrode provided on a subpixel-by-subpixel basis, an anode electrode provided commonly for a plurality of subpixels in an upper layer with respect to the cathode electrode, a light emitting layer provided between the cathode electrode and the anode electrode, a first wiring line provided in a same layer as the cathode electrode, and a second wiring line provided in an upper layer with respect to the first wiring line and a lower layer with respect to the anode electrode, the second wiring line being superimposed on the first wiring line.

Second Aspect

The display device according to, for example, the first aspect, wherein the first wiring line, the second wiring line, and the anode electrode are electrically connected.

Third Aspect

The display device according to, for example, the first or second aspect, wherein an electron control layer is provided between the cathode electrode and the light emitting layer, and the second wiring line is formed in a same layer and of a same material as the electron control layer.

Fourth Aspect

The display device according to, for example, the third aspect, wherein the electron control layer and the second wiring line are each formed of an oxide semiconductor.

Fifth Aspect

The display device according to, for example, the fourth aspect, wherein the oxide semiconductor has optical transparency.

Sixth Aspect

The display device according to, for example, the fourth aspect, wherein the electron control layer functions as an electron transport layer and an electron injection layer.

Seventh Aspect

The display device according to, for example, the fourth aspect, including a drive transistor connected to the cathode electrode and including an oxide semiconductor, wherein the drive transistor has N channels.

Eighth Aspect

The display device according to, for example, the seventh aspect, wherein the oxide semiconductor included in the drive transistor has a different electric resistance value from an electric resistance value of the second wiring line.

Ninth Aspect

The display device according to, for example, any one of the first to eighth aspects, wherein the cathode electrode has light reflectivity, and the anode electrode has optical transparency.

Tenth Aspect

The display device according to, for example, any one of the first to ninth aspects, wherein the first wiring line is provided at least between adjacent subpixels of a same color and between adjacent subpixels of different colors.

Eleventh Aspect

The display device according to, for example, any one of the first to tenth aspects, wherein an organic insulating film is provided in an upper layer with respect to the cathode electrode and a lower layer with respect to the anode electrode, and the organic insulating film includes a main opening where the light emitting layer is formed and a sub-opening where at least part of the second wiring line is formed in an interior and which has a belt shape or a dot shape in a plan view.

Twelfth Aspect

The display device according to, for example, the eleventh aspect, wherein the organic insulating film includes an edge cover portion configured to cover an edge of the cathode electrode and a thick film portion formed thicker than the edge cover portion in a position lying close to the edge cover portion.

Thirteenth Aspect

The display device according to, for example, the twelfth aspect, wherein the sub-opening portion having the belt shape is in contact with the thick film portion in a plan view.

Fourteenth Aspect

The display device according to, for example, the twelfth aspect, wherein the sub-opening portion having the dot shape is not in contact with the thick film portion.

Fifteenth Aspect

A display device including a cathode electrode provided on a subpixel-by-subpixel basis, an anode electrode provided commonly for a plurality of subpixels, a light emitting layer provided between the cathode electrode and the anode electrode, and an electron control layer provided between the cathode electrode and the light emitting layer and formed of an oxide semiconductor.

Sixteenth Aspect

A display device manufacturing method for manufacturing a display device including a cathode electrode provided on a subpixel-by-subpixel basis, an anode electrode provided commonly for a plurality of subpixels, a light emitting layer provided between the cathode electrode and the anode electrode, and an electron control layer provided between the cathode electrode and the light emitting layer, wherein the electron control layer is formed by patterning an oxide semiconductor film using a photolithography method.

Seventeenth Aspect

The display device manufacturing method according to, for example, the sixteenth aspect, wherein a first wiring line is formed in a same process as the cathode electrode, and a second wiring line is formed in a same process as the electron control layer.

Eighteenth Aspect

The display device manufacturing method according to, for example, the seventeenth aspect, wherein the anode electrode is formed to be in contact with the second wiring line, the anode electrode being solid.

Nineteenth Aspect

A display device manufacturing apparatus for manufacturing a display device including a cathode electrode provided on a subpixel-by-subpixel basis, an anode electrode provided commonly for a plurality of subpixels, a light emitting layer provided between the cathode electrode and the anode electrode, and an electron control layer provided between the cathode electrode and the light emitting layer, wherein the electron control layer is formed by patterning an oxide semiconductor film using a photolithography method.

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
4 TFT layer
5 Light emitting element layer
5R (Red) Light emitting element
6 Sealing layer
11 Base material
21 Flattening film
22 Cathode
23r, 23g Bank
25 Anode
70 Display device manufacturing apparatus
SPR (Red) Subpixel
HWx First wiring line
HWy Second wiring line
EM Light emitting layer EC Electron control layer
Tr Transistor

The invention claimed is:

1. A display device comprising:
a cathode electrode provided on a subpixel-by-subpixel basis;
an anode electrode provided commonly for a plurality of subpixels in an upper layer with respect to the cathode electrode;
a light emitting layer provided between the cathode electrode and the anode electrode;
a first wiring line provided in a same layer as the cathode electrode; and
a second wiring line provided in an upper layer with respect to the first wiring line and a lower layer with respect to the anode electrode, the second wiring line being superimposed on the first wiring line,
wherein an electron control layer is provided between the cathode electrode and the light emitting layer, and
the second wiring line is formed in a same layer and of a same material as the electron control layer.

2. The display device according to claim 1,
wherein the first wiring line, the second wiring line, and the anode electrode are electrically connected.

3. The display device according to claim 1,
wherein the electron control layer and the second wiring line are each formed of an oxide semiconductor.

4. The display device according to claim 3,
wherein the oxide semiconductor has optical transparency.

5. The display device according to claim 3,
wherein the electron control layer functions as an electron transport layer and an electron injection layer.

6. The display device according to claim 3, comprising:
a drive transistor connected to the cathode electrode and including an oxide semiconductor,
wherein the drive transistor has N channels.

7. The display device according to claim 6,
wherein the oxide semiconductor included in the drive transistor has a different electric resistance value from an electric resistance value of the second wiring line.

8. The display device according to claim 1,
wherein the cathode electrode has light reflectivity, and the anode electrode has optical transparency.

9. The display device according to claim 1,
wherein the first wiring line is provided at least between adjacent subpixels of a same color and between adjacent subpixels of different colors.

10. The display device according to claim 1,
wherein an organic insulating film is provided in an upper layer with respect to the cathode electrode and a lower layer with respect to the anode electrode, and
the organic insulating film includes a main opening where the light emitting layer is formed and a sub-opening where at least part of the second wiring line is formed in an interior, the sub-opening having a belt shape or a dot shape in a plan view.

11. The display device according to claim 10,
wherein the organic insulating film includes an edge cover portion configured to cover an edge of the cathode electrode and a thick film portion formed thicker than the edge cover portion in a position lying close to the edge cover portion.

12. The display device according to claim 11,
wherein the sub-opening portion having the belt shape is in contact with the thick film portion in a plan view.

13. The display device according to claim 11,
wherein the sub-opening portion having the dot shape is not in contact with the thick film portion.

14. A display device comprising:
a cathode electrode provided on a subpixel-by-subpixel basis;
an anode electrode provided commonly for a plurality of subpixels in an upper layer with respect to the cathode electrode;
a light emitting layer provided between the cathode electrode and the anode electrode;
a first wiring line provided in a same layer as the cathode electrode; and
a second wiring line provided in an upper layer with respect to the first wiring line and a lower layer with respect to the anode electrode, the second wiring line being superimposed on the first wiring line,
wherein an organic insulating film is provided in an upper layer with respect to the cathode electrode and a lower layer with respect to the anode electrode, and
the organic insulating film includes a main opening where the light emitting layer is formed and a sub-opening where at least part of the second wiring line is formed in an interior, the sub-opening having a belt shape or a dot shape in a plan view.

15. The display device according to claim 14,
wherein the organic insulating film includes an edge cover portion configured to cover an edge of the cathode electrode and a thick film portion formed thicker than the edge cover portion in a position lying close to the edge cover portion.

16. The display device according to claim 15,
wherein the sub-opening portion having the belt shape is in contact with the thick film portion in a plan view.

17. The display device according to claim 15,
wherein the sub-opening portion having the dot shape is not in contact with the thick film portion.

18. The display device according to claim 14,
wherein the first wiring line, the second wiring line, and the anode electrode are electrically connected.

19. The display device according to claim 14,
wherein the cathode electrode has light reflectivity, and the anode electrode has optical transparency.

20. The display device according to claim 14,
wherein the first wiring line is provided at least between adjacent subpixels of a same color and between adjacent subpixels of different colors.

* * * * *